United States Patent [19]

Hochstein

[11] Patent Number: 5,782,555
[45] Date of Patent: Jul. 21, 1998

[54] HEAT DISSIPATING L.E.D. TRAFFIC LIGHT

[76] Inventor: Peter A. Hochstein, 2966 River Valley Dr., Troy, Mich. 48098

[21] Appl. No.: 671,249

[22] Filed: Jun. 27, 1996

[51] Int. Cl.$^6$ ...................................... F21V 29/00
[52] U.S. Cl. ..................... 362/373; 362/294; 362/800
[58] Field of Search ........................... 362/227, 234, 362/235, 249, 294, 373, 800

[56] References Cited

U.S. PATENT DOCUMENTS

| | | |
|---|---|---|
| 4,729,076 | 3/1988 | Masami et al. |
| 5,008,788 | 4/1991 | Palinkas ........................... 362/800 |
| 5,038,255 | 8/1991 | Nishihashi et al. .............. 362/800 |
| 5,528,474 | 6/1996 | Roney et al. ..................... 362/373 |

*Primary Examiner*—Y My Quach
*Attorney, Agent, or Firm*—Howard & Howard

[57] ABSTRACT

An electrically driven L.E.D. lamp assembly (14) comprising an electrically insulating circuit board (26) having opposed first and second surfaces with light emitting diodes (28) having positive and negative leads (30, 32) mounted on the first surface and an electrically conductive plating on the first surface for establishing discrete and electrically conductive paths (34) for electrically interconnecting the positive lead (30) of one the light emitting diodes to the negative lead (32) of another of the light emitting diodes. A plurality of holes extend through the board (26) and a plurality of pads (50) of thermally conductive plating are disposed on the second side with each pad (50) associated with one of the holes and a thermally conductive material extending through the holes and thermally connecting each of the pads (50) and one of the leads to conduct heat from each of the leads to one of the pads (50) while maintaining electrical isolation between the pads. The pads (50) are rectangular in area configuration and are separated by a grid of crossing lines (54) of separation, the lines (54) being in transverse groups with all the lines (54) in one group being parallel and at right angles to the lines (54) in the other group and are separated from one another a discrete distance which is only of a magnitude sufficient to prevent electrical conductivity from pad (50) to pad (50). A heat sink includes a base (36) overlying the second surface and a shell (38) extending forwardly from the base (36) in front of the light emitting diodes (28) for conducting heat to the light emitting side of the assembly.

10 Claims, 3 Drawing Sheets

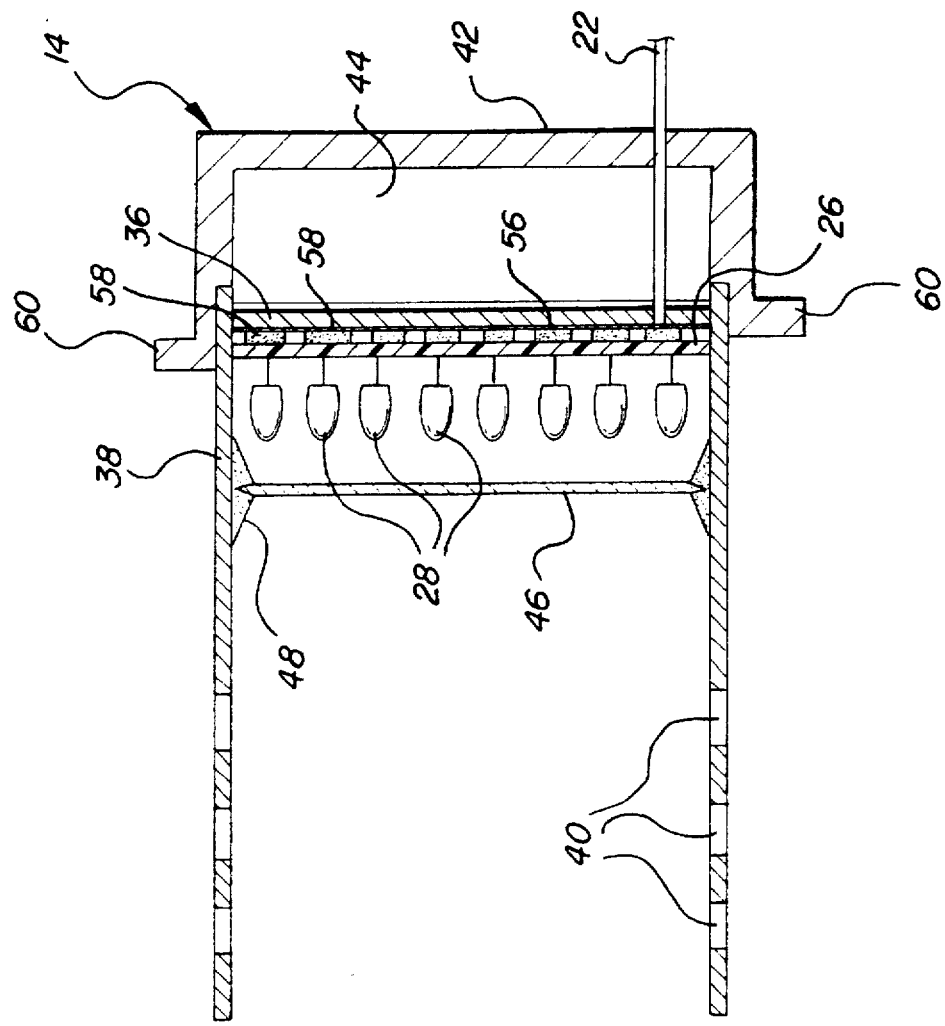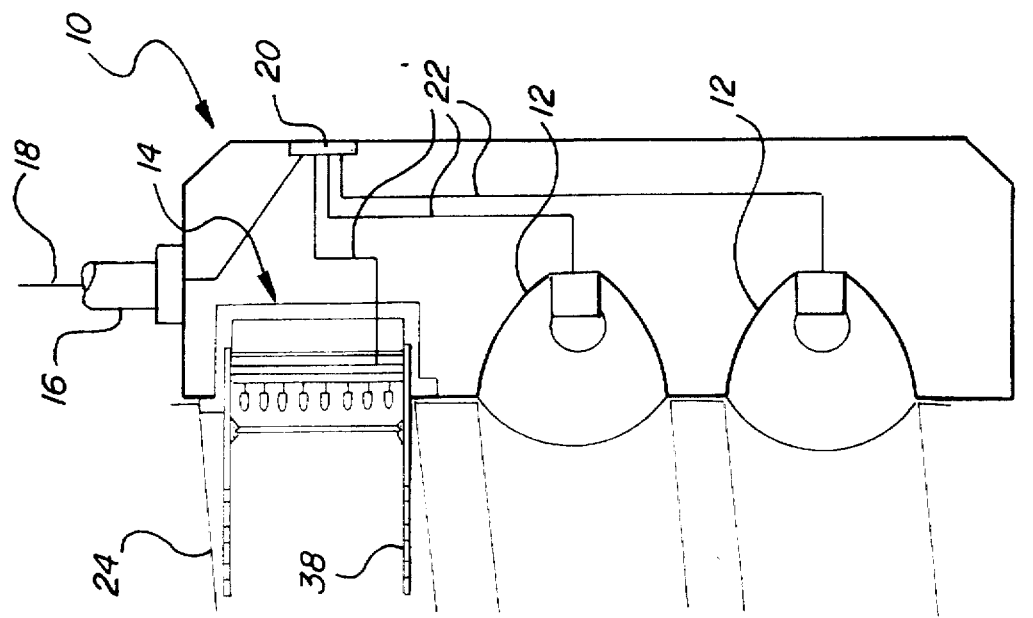

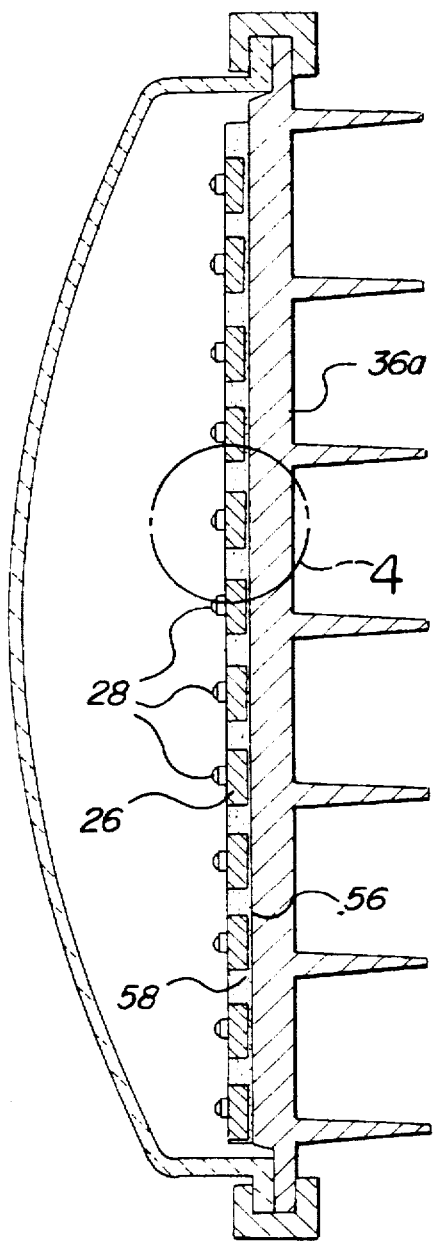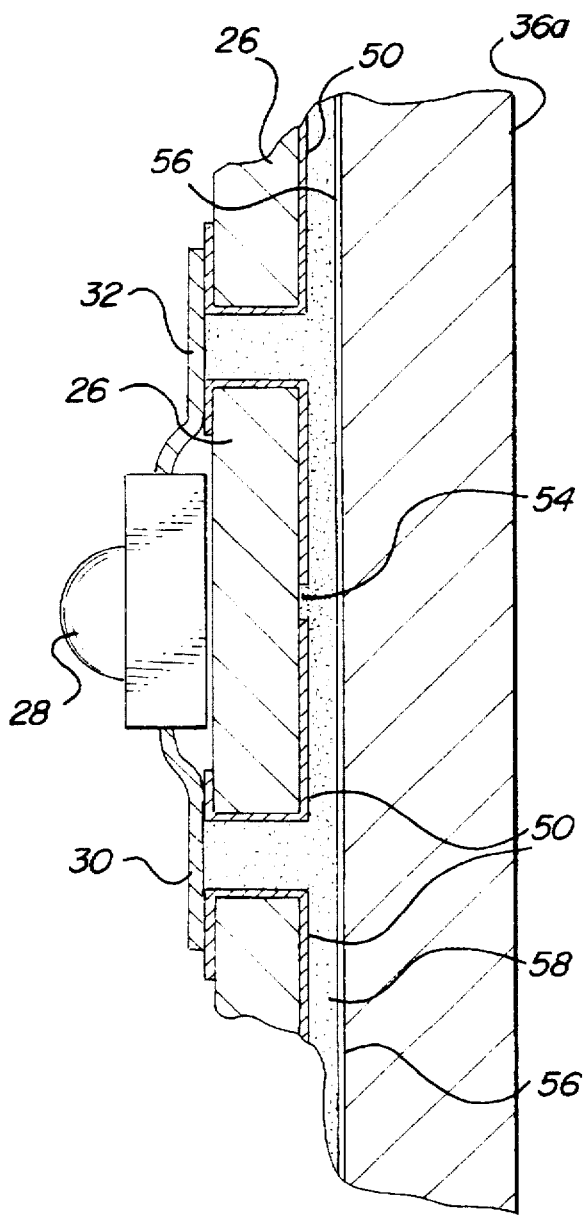
FIG-3
FIG-4

HEAT DISSIPATING L.E.D. TRAFFIC LIGHT

TECHNICAL FIELD

The subject invention relates to light emitting diodes mounted in an array on a circuit board and, more particularly, to the dissipation of heat generated by the diodes. Such light emitting diode assemblies have particular utility in traffic signals.

BACKGROUND OF THE INVENTION

Newly developed light emitting diode traffic signals are exhibiting useful service lives that are much shorter than predicted. The expected life of such signals is at least five to seven years, but actual field experience with some of these devices demonstrates significant dimming of the L.E.D. after two years or less. The relatively high cost of the L.E.D. conversions suggests that a minimum three year life is necessary in order to amortize the acquisition cost. Energy savings, which can exceed eighty percent, are typically used to finance the conversion of incandescent lamps to the L.E.D. variants, in combination with the cost savings attributed to lower relamping expenses.

Both the purchasers and manufacturers of L.E.D. traffic signals seem to be puzzled by the relatively poor performance of the devices in the field. It is important to note that most L.E.D. component manufacturers predict lifetimes in excess of one hundred thousand hours. The widely divergent results observed in actual field experience vis a vis that observed in a laboratory environment suggests that the field operating conditions are very unlike those used to predict device lifetimes.

L.E.D.s are commonly rated at some nominal average operating current (20 mA) and temperature, (typically 25° C.) for a given luminous output. Useful life is specified as the point in time (hours) at which the luminous output is half the initial value.

Recent experiments with a wide variety of L.E.D.s suggest an exponential relationship of life versus operating temperature. The well known Arhenius function is an approximate model for LED degradation: $D \propto t e^{k/T}$ where D is the degradation, t is time, e the base of natural logarithms, k an activation constant T the absolute temperature in degrees Kelvin.

While this formulation is necessarily inexact, and is clearly device dependent, within a given L.E.D. family the empirical data can be modeled satisfactorily. The impact of this realization is dramatic. While room temperature (25° C.) lifetimes may in fact approach one hundred thousand hours, operation at close to 90° C. may reduce L.E.D. life to less than seven thousand hours.

Interestingly, neither users nor manufacturers of L.E.D.s specify operation of L.E.D. devices at temperatures approaching 90° C. Actual data collected in solar heating studies of traffic signals show that internal temperatures approaching 85° C. may be rather common in the U.S. Southwest. In fact, at ambient temperatures of 40° C. which are rather common, solar gain within the traffic signal housing can further increase the temperature nearly 30° C., without even operating the L.E.D. signals. The added thermal loading due to power supply losses and L.E.D. dissipation pushes the actual L.E.D. operating environment to temperatures in excess of 85° C. (185° F.) for at least a significant part of the day.

The problem of high internal temperatures is exacerbated in cases where L.E.D. lamps are intermixed with incandescent lamps. For example, if, in a given housing, only the red incandescent lamp is converted to an L.E.D. lamp, and the amber and green incandescent lamps are retained, the heat generated by the illuminated incandescent lamps will greatly increase the temperature surrounding the L.E.D. lamp.

Obviously, venting the L.E.D. traffic lamp assembly or module into the sealed traffic signal housing is futile. Rejecting heat into an environment of higher temperature than that of the source is thermodynamically impossible. The key to improving the life of the L.E.D.s in traffic signal service is to reduce the temperature of the L.E.D. environment. Note that little can be done to modify the "ambient" temperature which is the normal surrounding air temperature.

U.S. Pat. No. 4,729,076 to Masami et al strives to lower the temperature of the LED array by attaching a finned heat sink assembly. However, there is a choke or restrictor in the path of the heat from the light emitting diodes to the heat sink; to wit, a resin filler or adhesive which is a very poor heat conductor. The Masami '076 patent recognizes the problem of positioning the heat sink within the traffic signal housing where it must exchange heat with the air within the housing. As noted in the Masami '076 patent, some means of ventilation must be provided by vents, louvers, fans or the like, when the heat sink is within the housing. Such provisions are not particularly effective in hot climates, and they subject the signal to dirt and moisture infiltration. Since the lens, reflector and lamp assembly is not separately sealed in traditional housings, moisture or dust that enters a conventional signal housing will degrade the optical performance of the unit and cause corrosion of exposed electrical components. Experiments with baffled vents suggest that substantial (size) openings at the bottom and top of the traffic signal housing would be necessary to provide unimpeded (low back pressure) air flow through the housing. Clearly, retrofitting LED lamps into existing traffic signal housings that do not have venting provisions is futile, because of heat loading. Field modification of existing housings to provide adequate venting is costly, time consuming and of limited utility because of the size of openings that are necessary. To overcome this venting problem, the Masami '076 patent suggests placing the heat sink on the back of the housing and exposed to ambient air with a heat conduit to transfer heat from the LEDs to the heat sink. Again, field modification of existing housings to mount a heat sink on the back of the housing is costly, time consuming and of limited utility because there still remains the restriction or choke of heat transfer from the LEDs to the heat sink.

SUMMARY OF THE INVENTION AND ADVANTAGES

One feature of the invention provides an electrically driven L.E.D. lamp assembly comprising an electrically insulating circuit board having opposed first and second surfaces with light emitting diodes having positive and negative leads mounted on the first surface and an electrically conductive plating on the first surface for establishing discrete and electrically conductive paths for electrically interconnecting the positive lead of one the light emitting diodes to the negative lead of another of the light emitting diodes. A plurality of holes extend through the board and a plurality of pads of thermally conductive plating are disposed on the second side with each pad associated with one of the holes and a thermally conductive material extending through the holes and thermally connecting each of the pads and one of the leads to conduct heat from each of the leads to one of the pads while maintaining electrical isolation between the pads. The pads extend laterally from the holes and are separated from one another a discrete distance which is only of a magnitude sufficient to prevent electrical conductivity from pad to pad.

Another feature of the invention provides an electrically driven L.E.D. lamp assembly comprising an electrically insulating circuit board having opposed first and second surfaces with light emitting diodes having positive and negative leads mounted on the first surface and an electrically conductive plating on the first surface for establishing discrete and electrically conductive paths for electrically interconnecting the positive lead of one the light emitting diodes to the negative lead of another of the light emitting diodes. A heat sink includes a base overlying the second surface and a shell extending forwardly from the base in front of the light emitting diodes for conducting heat to the light emitting side of the assembly.

Accordingly, the invention provides two solutions to the heat dissipation problem which can be utilized in combination or separately to open the restriction or choke of heat flow from the LEDs to the heat sink and/or to extend the heat sink from close proximity to the LEDs to the ambient air forwardly of the lamp assembly, either of which significantly reduces the build up of temperature within the housing and when combined provide heretofore unattainable low operating temperatures within the housing.

BRIEF DESCRIPTION OF THE DRAWINGS

Other advantages of the present invention will be readily appreciated as the same becomes better understood by reference to the following detailed description when considered in connection with the accompanying drawings wherein:

FIG. 1 is a cross sectional view of a traffic light enclosure with the prior art incandescent lamp in two of the openings and a preferred embodiment of the subject invention mounted in the upper opening;

FIG. 2 is a cross sectional view of a preferred embodiment of the subject invention;

FIG. 3 is a cross sectional view of a second embodiment;

FIG. 4 is an enlarged cross sectional view of a portion of FIG. 3;

DETAILED DESCRIPTION OF THE PREFERRED EMBODIMENT

Figure 5:
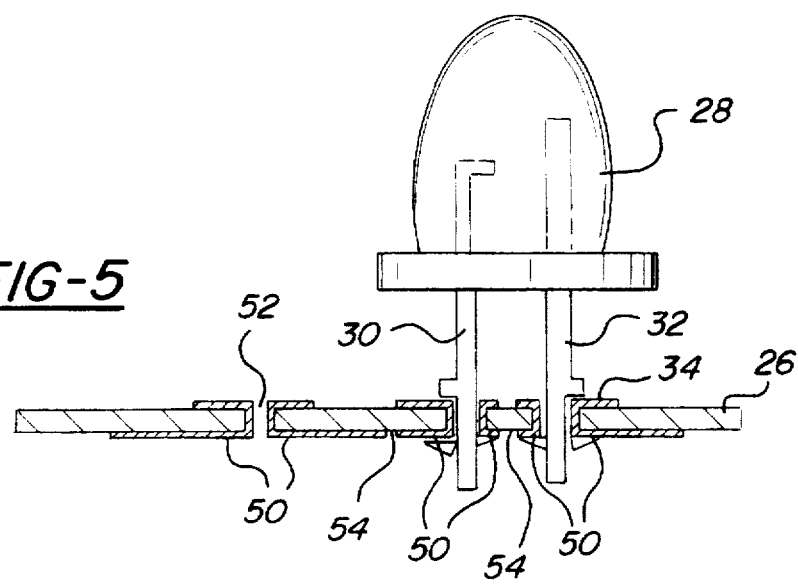
FIG. 5 is an enlarged fragmentary cross sectional view of an LED with leads extending through the board.

Referring to the Figures, wherein like numerals indicate like or corresponding parts throughout the several views, a traffic light housing is indicated at 10 in FIG. 1. Conventional incandescent lights 12 are mounted in the housing 10. In addition an electrically driven light emitting diode (L.E.D.) lamp assembly, constructed in accordance with the subject invention and generally indicated at 14, is also mounted in the housing 10. The traffic light housing 10 is hung by a hanger 16 through which an electrical power line 18 leads to a terminal block 20. Respective leads 22 transfer electrical power to each of the lamp assemblies 12 and 14. Conventional sun hoods 24 extend forwardly about the opening in the housing in which the lamp assemblies are mounted.

One embodiment of the electrically driven L.E.D. lamp assembly 14 is best shown in FIG. 2 and comprises an electrically insulating circuit board 26 having opposed first and second surfaces with light emitting diodes 28 having leads 30 and 32 (positive and negative) mounted on the first surface and an electrically conductive plating on the first surface for establishing discrete and electrically conductive paths 34 for electrically interconnecting the positive lead 30 of one the light emitting diodes 28 to the negative lead 32 of another of the light emitting diodes 28.

A heat sink includes a base 36 overlying the second or back surface of the circuit board and a shell 38 extending forwardly from the base 36 in front of the light emitting diodes 28 for conducting heat to the light emitting side of the assembly. In other words, the shell 38 conducts heat from the LEDs of the back side of the circuit board to the ambient air within the sun hood 24, it being important that the shell 38 be spaced radially from the sun hood 24 to allow the free circulation of air and to prevent the transfer of heat from the hood 24 to the shell 38. To increase heat transfer, the shell 38 includes perforations 40 therein to allow for air passage and increase the surface area for radiating heat.

A casing 42 surrounds the base 36 of the heat sink and insulating material 44 is disposed between the base 36 and the casing 42 to limit heat transfer to the heat sink from outside the casing 42. A transparent cover 46 is retained within the shell 38 by a weather seal 48.

Figure 6:
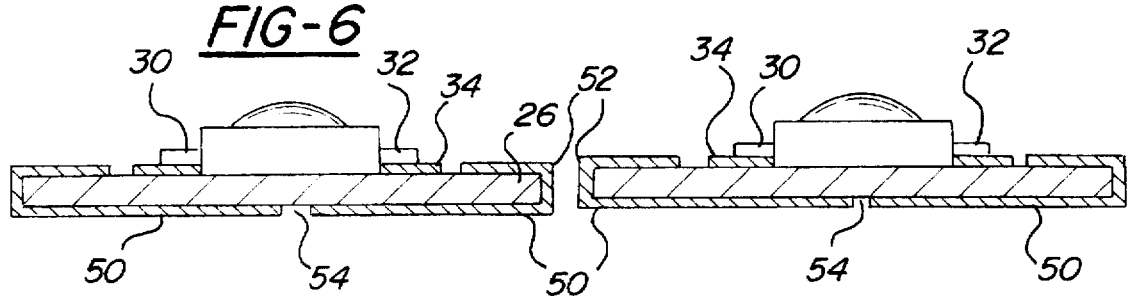
FIG. 6 is an enlarged fragmentary cross sectional view of and LED surface mounted on the board.

In order to increase the transfer of heat from the circuit board 26 to the heat sink, whether it be the improved heat sink base 36 and shell 38 or the conventional heat sink 36(a) shown in FIGS. 3 and 4, the electrically insulating circuit board 26 has a plurality of holes extending therethrough and a plurality of pads 50 of thermally conductive plating on the second side with each pad 50 associated with one of the holes. In some instances the holes may be the holes through which the LED leads 30 and 32 extend with each of the lead holes providing thermal conductivity to one of the pads 50. In addition to the lead holes for the leads 30 and 32, there may be included a plurality of holes 52 dispersed among the lead holes, as shown in FIG. 5. In the case of surface mounted LEDs, the LED leads 30 and 32 may extend over the lead holes as shown in FIG. 4 or there are no lead holes and only the through holes 52 are provided as shown in FIG. 6. In all cases the plating material is homogeneous, that is, the electrical paths 34 between LED leads 30 and 32 are integral with and are an extension of the pads 50 by extending through the lead holes and the specially provided holes 52. Accordingly, heat is transferred from the leads 30 and 32 through the plating as it continues through the holes and into the pads 50.

The pads 50 extend laterally from the holes and are separated from one another a discrete distance 54 (alternatively referred to as spaces, lines or isolation traces) which is only of a magnitude sufficient to prevent electrical conductivity from pad to pad. Therefore, the thermally conductive material extends through the holes and thermally connects each of the pads 50 and one of the leads 30 or 32 to conduct heat from each of the leads to one of the pads 50 while maintaining electrical isolation between the pads 50 by the spaces 54 therebetween. The pads 50 are multi-sided, i.e., rectangular in area configuration and are separated by a grid of crossing lines 54 of separation, the lines 54 being in transverse groups with all the lines 54 in one group being parallel and at right angles to the lines 54 in the other group. It will be appreciated, however, the shapes of the pads 50 may vary, hexagonal being an efficient use of area.

In order to conduct as much heat as possible per unit of time the heat sink should overlay the pads 50 with minimal spacing therebetween while, at the same time preventing contact between the heat sink and the pads 50 to prevent electrical shorting between the pads 50. Accordingly, a thin layer 56 of electrically insulating material disposed between the pads 50 and the heat sink to prevent electrical shorting between the pads 50 by the flow of electrical current through the heat sink. An adhesive 58 secures the board 26 to the insulating layer 56. Without the insulating layer 56, the pads 50 could be pressed into engagement with the metal, preferably aluminum, heat sink 36 or 36(a). On the other hand, the adhesive 58 may itself comprise the electrically insulating but heat conductive layer to both secure the board 26 and pads 50 to the heat sink 36 or 36(a). In other words, the adhesive layer 58 could be used without the electrically insulating layer 56 so long as the pads are maintained in spaced non-conductive relationship with the heat sink, or both the adhesive 58 and the insulating layer 56 could be laminated together.

The majority of the area, which is occupied by the pads 50, the holes (lead holes and additional holes 52) and the discrete distances 54, on said second side of the board is taken up by the pads 50. In other words, the pads 50 occupy the majority of the area of the bottom of the board 26; i.e., only enough space is devoted to the discrete non-conductive distances to prevent electrical shorting. Clearly, the majority is over eighty percent.

As noted, some traffic signal housings may reach internal temperatures of 90° C. (195° F.) in high solar loading conditions. While venting the housing is certainly possible, the necessity for substantial field work on the housing may be costly and inconvenient. Accordingly, this invention provides other means of rejecting LED heat to the environment (surrounding air). Instead of trying to reject heat into the traffic signal housing which may in fact be at a higher temperature than the LED assembly itself, one aspect of the present invention is to facilitate rejection of heat through the front of the signal housing, around the lens opening.

As shown in FIG. 2, the LED lamp 28 array is enclosed in a thermally conductive metal tube or cylindrical shell 38 which can conduct heat from the base or bottom 36 along the side walls of the shell 38 to outside ambient air. That is, instead of trying to reject heat to the air within the traffic signal housing, heat is directly rejected to outside air. The use of a cylindrical heat sink with an integral (flat) base 36 as shown, allows for efficient coupling of the LED mounting substrate or circuit board 26 to the enclosure base 36 by means of a thermally conductive (loaded) epoxy 58. While optimal, such coupling may not be necessary in all cases, and thermal exchange by means of the heated air would suffice. Added thermal coupling between the walls 38 of the metallic cup and the heated air will further improve heat dissipation of the LED array. In most cases, traffic signals are equipped with shading hoods 24 to improve signal visibility. These hoods 24 are commonly canted at about 7½° to the horizon, and effectively keep direct sunlight out of the signal lens. The proposed metal heat sink 36 and 38, which is preferably fabricated of drawn or spun aluminum, fits within the hood 24. A small air space between the outer hood 24 and inner tubular shell 38 keeps thermal coupling between these two components at a minimum. The outer hood 24 is usually exposed to direct sunlight and can get much hotter than the surrounding air.

The small perforations 40 in the shell 38, outside the sealed region of the LED lamp will prevent thermal stagnation of air trapped between the two tubular sections. A blackened interior cylindrical surface may be provided to enhance contrast (currently common practice). Since the base 36 of the cylindrical shell is thermally conductive, heat from the interior of the signal housing 10 could be added to the LED lamp 14 unless insulation is provided at the base of the LED housing. A simple plastic cover 42 with an air space or thermal insulation material 44 will effectively thermally decouple the signal housing 10 from the LED signal lamp assembly 14. Provisions for mounting the LED lamp assembly 14 in standard housings 10 could be accommodated by merely including a flange 60 on the outer diameter of the rear casing 42. Note that the use of existing sun hoods 24 prevents direct solar heating of the aluminum shell 38, which would add significant heat to the LED array.

The transparent, clear or tinted front cover 46 could be inserted in the tubular shell 38 to seal the LED lamp assembly 14 against moisture and dust. Lenses, prisms or other beam steering optics could be incorporated into the front shell 38 or alternatively be added as a separate optical assembly. Compliant sealing agents such as various elastomers, plastics or epoxies could be used to mount the front cover 46 to the tubular shell 38 for sealing and to allow for differential thermal expansion between the plastic and metal elements, which are exposed to a wide range of operating temperatures.

In order to accommodate the nominal 7½° canted sun hoods 24, the LED lamp assembly 14, including the tubular shell 38, could be similarly canted by the mounting flange 60. Since virtually all properly designed signals exhibit an asymmetric optical pattern, the unique canted configuration ensures that the signal will be correctly installed in the housing. That is, the LED lamp assembly 14 cannot be mounted out of position because the canted tubular shell 38 would physically interfere with the sun hood 24.

In colder regions, blown snow can effectively obscure signals, leading to potentially dangerous situations. Heat conducted along the tubular heat sink will help melt any snow that accumulates in the signal opening.

The other feature of the present invention is the enhanced thermal dissipation from the LEDs as they are mounted onto a thermally conductive heat sink. As noted, a thermally conductive adhesive 58 such as a filled epoxy or resin may be used to transfer heat from the LED array and circuit board 26 to the metallic heat sink 36, 36(a). However, the best thermally conductive, electrically insulative compounds exhibit heat transfer coefficients that are orders of magnitude lower than most metals. To remedy this situation, the LED leads 30 and 32 are soldered or bonded to the respective conductive pads 50 on the circuit substrate 26 (printed circuit board) in a manner so as to maximize the thermal transfer from the LED component leads 30 and 32 to the conductive pads 50.

Commonly, circuit boards are designed with small isolated pads or islands of copper on the supporting substrate. The necessary circuitry interconnects and /or isolates the various components as required. Plated through holes or vias generally interconnect the conductor pattern or paths 34 on one side to the other side of the board for electrical continuity.

Figure 7:
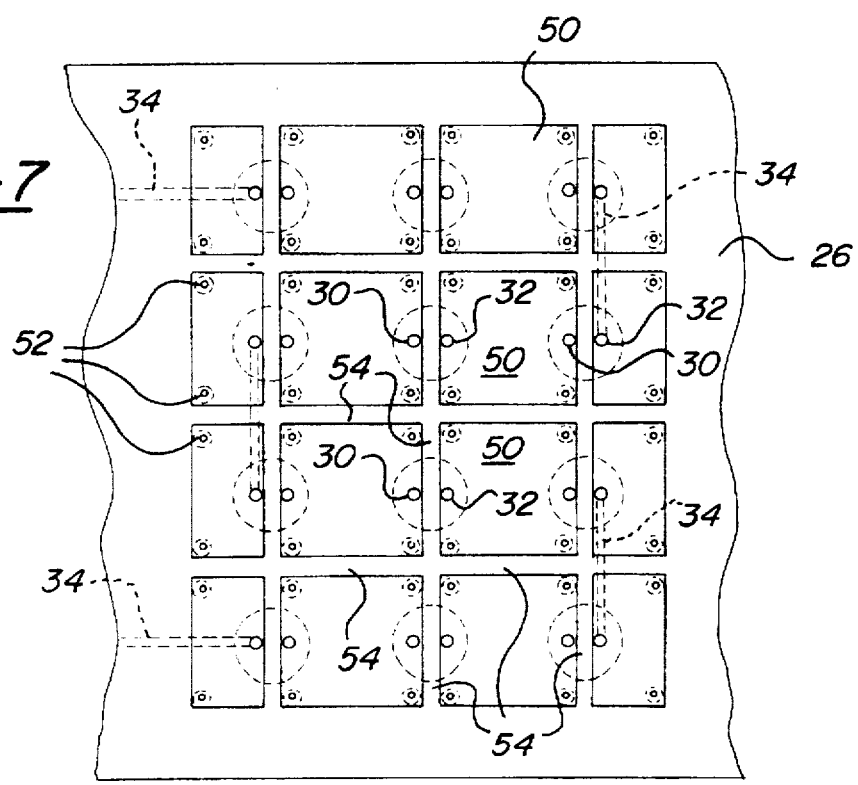
FIG. 7 is a fragmentary plan view of the second side of the board showing the thermal pads.

A very beneficial improvement in heat extraction from the LEDs 28 to the circuit board 26 and from the circuit board to the heat sink 36, 36(a) is achieved by this modification of standard circuit board practice. As shown in FIGS. 2, 5 and 6, a standard circuit board 26 is provided with double sided copper plating. The first side is configured with the necessary interconnection lines or paths 34 and component connectors, while the second side, the side mounted against the conductive heat sink, is etched to retain virtually all the copper cladding, as is shown in FIG. 7. In order to retain component isolation, fine openings or isolation traces 54 are etched into this heat spreader layer. The function of these large conductive pads (copper) 50 is to act as heat spreaders that take the heat from the LED leads 30 and 32 and dissipate it to the mounting surface of the substrate where it can be driven into the thermally conductive heat sink 36, 36(a). A large number of plated through holes are used to interconnect the topmost and the bottom layer. That is, plated through holes that are normally used only for electrical coupling are used for thermal coupling. A typical enhanced thermal dissipation LED assembly will have many more unoccupied (component-less) holes 52 in addition to the holes filled with the leads 30 and 32 of the active components. An additional benefit of these "extra" holes 52 is the ability of the thermal bonding compound (resin) 58 to partly fill the holes 52 and improve physical attachment, while enhancing thermal transfer, to the thermally conductive heat sink 36, 36(a).

The invention has been described in an illustrative manner, and it is to be understood that the terminology which has been used is intended to be in the nature of words of description rather than of limitation.

Obviously, many modifications and variations of the present invention are possible in light of the above teachings. It is, therefore, to be understood that within the scope of the appended claims, wherein reference numerals are merely for convenience and are not to be in any way limiting, the invention may be practiced otherwise than as specifically described.

What is claimed is:

1. An electrically driven L.E.D. lamp assembly (14) comprising:

an electrically insulating circuit board (26) having opposed first and second surfaces, light emitting diodes (28) mounted on said first surface, each of said light emitting diodes (28) having positive and negative leads (30, 32), an electrically conductive plating on said first surface for establishing discrete and electrically conductive paths (34) for electrically interconnecting said positive lead (30) of one of said light emitting diodes (28) to said negative lead (32) of another of said light emitting diodes (28), a plurality of first holes through said board (26), a plurality of pads (50) of thermally conductive plating on said second surface with each pad associated with one of said holes, said pads (50) extending laterally from said holes and being separated from one another a discrete distance (54) which is only of a magnitude sufficient to prevent electrical conductivity from pad to pad, said pads (50) being multi-sided and said discrete distance (54) being defined by a grid of thin lines separating said pads (50), said pads (50) occupying over eighty percent of an area over which said grid lines extend, a thermally conductive first material extending through said holes and thermally connecting each of said pads (50) and one of said leads (30, 32) to conduct heat from each of said leads (30, 32) to one of said pads (50) while maintaining electrical isolation between said pads (50), a heat sink (36, 36(a)) overlying said pads (50), and a thin layer (58) of electrically insulating and thermally conductive second material disposed between said pads (50) and said heat sink (36, 36(a)) to prevent electrical shorting between said pads (50) by said heat sink (36, 36(a)) while maximizing heat transfer to said heat sink (36, 36(a)).

2. An assembly as set forth in claim 1 including a plurality of lead holes extending through said board (26) with said first material extending through each of said lead holes to provide thermal conductivity from each lead hole to one of said pads (50), said first holes (52) being dispersed among said lead holes.

3. An assembly as set forth in claim 1 wherein said heat sink includes a base (36) overlying said pads (50) and a shell (38) extending forwardly from said base (36) in front of said light emitting diodes (28) for conducting heat forwardly of said first surface of said circuit board (26).

4. An assembly as set forth in claim 3 including a casing (42) surrounding said base (34) of said heat sink, insulating material (44) disposed between said base (34) and said casing (42) to limit heat transfer to said heat sink from outside said casing (42).

5. An assembly as set forth in claim 4 including a traffic light housing (10) presenting a light opening and a sun hood (24) extending from said opening, said casing (42) mounted in said opening with said shell (38) extending forwardly within and spaced from said sun hood (24).

6. An assembly as set forth in claim 4 wherein said shell (38) includes perforations (40) therein for radiating heat.

7. An electrically driven L.E.D. lamp assembly comprising:

an electrically insulating circuit board (26) having opposed first and second surfaces, light emitting diodes (28) mounted on said first surface, each of said light emitting diodes (28) having positive and negative leads (30, 32), an electrically conductive plating on said circuit board (26) for establishing discrete and electrically conductive paths for electrically interconnecting said positive lead of one of said light emitting diodes (28) to said negative lead of another of said light emitting diodes (28), a heat sink having a base (36) overlying said second surface and a shell (38) extending forwardly from said base (36) in front of said light emitting diodes (28) for conducting heat forwardly of said first surface of said circuit board (26) and a traffic light housing (10) presenting a light opening and a sun hood (24) extending from said opening, a casing (42) surrounding surrounding said base and mounted in said opening with said shell (38) extending forwardly within and spaced from said sun hood (24).

8. An assembly as set forth in claim 7 including a plurality of holes through said board (26), a plurality of pads (50) of thermally conductive plating on said second surface with each pad associated with one of said holes, and a thermally conductive material extending through said holes and thermally connecting each of said pads (50) and one of said leads (30, 32) to conduct heat from each of said leads (30, 32) to one of said pads (50) while maintaining electrical isolation between said pads (50).

9. An assembly as set forth in claim 7 including a casing (42) surrounding said base (36) of said heat sink, insulating material (44) disposed between said base (36) and said casing (42) to limit heat transfer to said heat sink from outside said casing (42).

10. An assembly as set forth in claim 7 wherein said shell (38) includes perforations (40) therein for radiating heat.

* * * * *